(12) United States Patent
Orikabe et al.

(10) Patent No.: US 6,380,343 B1
(45) Date of Patent: *Apr. 30, 2002

(54) CURABLE RESIN COMPOSITION FOR OVERCOAT OF FLEXIBLE CIRCUIT

(75) Inventors: Hiroshi Orikabe; Tadahiko Yokota, both of Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/619,497

(22) Filed: Jul. 19, 2000

Related U.S. Application Data

(63) Continuation of application No. 09/132,073, filed on Aug. 10, 1998, now Pat. No. 6,162,899.

(30) Foreign Application Priority Data

Aug. 14, 1997 (JP) .............................. 9-219610
Aug. 14, 1997 (JP) .............................. 9-219611
Aug. 29, 1997 (JP) .............................. 9-234022

(51) Int. Cl.⁷ .............................................. C08G 18/80
(52) U.S. Cl. ............................ 528/75; 528/60; 528/65; 528/45; 528/85; 525/124; 427/117; 428/364; 428/423.1; 428/901; 156/331.7
(58) Field of Search ............................ 528/60, 65, 75, 528/45, 85; 525/124; 427/117; 428/364, 423.1, 901; 156/331.7

(56) References Cited

U.S. PATENT DOCUMENTS

| | | | |
|---|---|---|---|
| 4,267,299 A | 5/1981 | Oechsle, III | 528/48 |
| 4,410,667 A | 10/1983 | Porter, Jr. et al. | 525/440 |
| 4,808,477 A * | 2/1989 | Harber | |
| 4,937,305 A * | 6/1990 | Okamoto et al. | |
| 5,126,479 A | 6/1992 | Diinwald et al. | 560/334 |

OTHER PUBLICATIONS

Patent Abstract of JP 56–032559 (Apr. 1981).
Derwent Abstract of JP 60–195168 (Oct. 1985).
Derwent Abstract of JP 62–072749 (Apr. 1987).
U.S. application No. 09/132,073, filed Aug. 10, 1998, Allowed, Docket No. 0010–0942–0.
U.S. application No. 09/418,506, filed Oct. 15, 1999, Pending, Docket No. 0010–1046–0.
U.S. application No. 09/619,497, filed Jul. 19, 2000, Pending, Docket No. 194460US0CONTPresent application; listed information.

\* cited by examiner

*Primary Examiner*—Rachel Gorr
(74) *Attorney, Agent, or Firm*—Oblon, Spivak, McClelland, Maier & Neustadt, P.C.

(57) ABSTRACT

Herein is desclosed a curable resin composition comprising at least one polyol selected from the group consisting of Polyol A, including polybutadiene polyol (Polyol Aa), Polyol B, including polybutadiene polyol (Polyol Ba) and polyester polyol (Polyol Bb), and Polyol C, and at least one polyblock isocyanate selected form the group consisting of polyblock isocyanate (Isocyanate X), including polybutadiene polyblock isocyanate (Isocyanate Xa), which is excellent in warp property, i.e., provides a low shrinkage, upon curing, and the cured products of which are particularly excellent in flexibility and excellent in such properties chemical resistance, heat resistance, electric insulation, bending resistance and adherence, and which is, therefore, suitable for overcoat of flexible circuit.

12 Claims, No Drawings

CURABLE RESIN COMPOSITION FOR OVERCOAT OF FLEXIBLE CIRCUIT

This application is a continuation of application Ser. No. 09/132,073 filed on Aug. 10, 1998 now U.S. Pat. No. 6,162,899.

BACKGROUND OF THE INVENTION

1. Field of the Invention

This invention relates to thermosetting resin compositions for overcoats of flexible circuits, which are particularly excellent in low shrinkage during curing and flexibility.

2. Prior Art

Formerly, the surface protective films of flexible wiring circuits include, for example, those prepared by cutting polyimide films, called as coverlay films, using a die made corresponding to the pattern, which are then adhered onto a substrate with an adhesive; and those prepared by applying a ultraviolet rays-curable or thermosetting overcoat composition the film from which is imparted with flexibility, according to the screen printing method, the latter being more advantageous in workability.

As such curable overcoats, resin compositions mainly consisting of an epoxy resin, an acryl resin, or a mixture thereof have been known. These resins often comprise, as main ingredients, a resin denatured by introducing, particularly, a butadiene or siloxane skeleton, or a long chain fatty skeleton, thereby improving flexibility and preventing warp due to cure shrinkage while trying to avoid reduction of inherent heat resistance, chemical resistance, and electrical insulation.

Recently, however, with lightening and miniaturization of electronic equipment (cameras, 8 mm automatic projectors, portable telephones, personal computers, printers, etc.), flexible substrates have been reduced in thickness and weight, and thus more remarkably affected by flexibility and cure shrinkage of the cured resin composition to be overcoated. Therefore, curing type overcoats do not satisfy requirements for warp upon cure shrinkage and flexibility of the cured products.

[Problems to be solved by the Invention]

In consideration of such points, there have been found no curable resin compositions having properties required of overcoats for flexible circuit such as low shrinkage during curing, and whose cured products have satisfactory properties such as flexibility, adherence, electrical insulation, chemical resistance, heat resistance, etc., and therefore development of such compositions has been expected.

SUMMARY OF THE INVENTION

The present inventors have studied intensively to solve the above problems. As the results, they have attained a group of inventions so linked as to form a single general inventive concept.

A first one of the group of inventions relates to a curable resin composition for overcoat of flexible circuit which comprises a polyol with a number-average molecular weight of 1,000–8,000 and having 2–10 hydroxyl groups per molecule, said polyol being sometimes referred to as "Polyol A" herein, and a polyblock isocyanate, said isocyanate being sometimes referred to as "Isocyanate X" herein; and a curable resin composition for overcoat of flexible circuit which comprises a polybutadiene polyol with a number-average molecular weight of 1,000–8,000 and having 2–10 hydroxyl groups per molecule, said polyol being sometimes referred to as "Polyol Aa" herein, and polybutadiene polyblock isocyanate with a number-average molecular weight of 1,000–8,000 and having 2–10 blockisocyanate groups per molecule, said isocyanate being sometimes referred to as "Isocyanate Xa" herein.

Said invention has been attained based on the findings by the present inventors that curing a urethane resin composition containing, as the main ingredient, a polyol with a number-average molecular weight of 1,000–8,000 and having 2–10 hydroxyl groups (Polyol A) and polyblock isocyanate (Isocyanate X) provides a low shrinkage upon curing, and that a protective film resulting from curing has such satisfactory flexibility, adherence, electric insulation, chemical resistance, heat resistance, and the like properties.

A second one of the group of inventions relates to a curable resin composition for overcoat of flexible circuit which comprises a polyol with a number-average molecular weight of 1,000–8,000 and having 2–10 hydroxyl groups per molecule (Polyol A), a polyol with a number-average molecular weight of 13,000–30,000 and having 2–10 hydroxyl groups per molecule, said polyol being sometimes referred to as "Polyol B" herein, and a polyblock isocyanate (Isocyanate X) as the essential ingredient, wherein the weight ratio (as solid content) of said two polyols is (Polyol A):(Polyol B)=40:60–90:10, and said polyblock isocyanate (Isocyanate X) is in an amount of 0.8–3.5 gram equivalents based on, i.e., per one gram equivalent of, the total hydroxyl groups of the two polyols (Polyol A plus Polyol B); and a curable resin composition for overcoat of flexible circuit which comprises a polyol with a number-average molecular weight of 200–600 and having 2–10 hydroxyl groups per molecule, said polyol being sometimes referred to as "Polyol C" herein, a polyol with a number-average molecular weight of 13,000–30,000 and having 2–10 hydroxyl groups per molecule (Polyol B), and a polyblock isocyanate (Isocyanate X), wherein the weight ratio (as solid content) of the polyols is (Polyol C):(Polyol B)=20:80–50:50 and the polyblock isocyanate (Isocyanate X) is in an amount of 0.8–3.5 gram equivalents based on the total hydroxyl groups of the polyols.

Said invention has been attained based on the findings by the present inventors that mixing a polyol with a number-average molecular weight of 1000–8,000 and having 2–10 hydroxyl groups per molecule (Polyol A) or a polyol with a number-average molecular weight of 200–600 and having 2–10 hydroxyl groups per molecule (Polyol C), and a polyol with a number-average molecular weight of 13,000–30,000 and having 2–10 hydroxyl groups per molecule (Polyol B), and a polyblock isocyanate (Isocyanate X) at a defined ratio provides a low shrinkage upon curing and that a protective film resulting from curing has such satisfactory flexibility, adherence, electric insulation, chemical resistance, heat resistance, and the like properties.

And, a third one of the group of inventions relates to a curable resin composition for overcoat of flexible circuit which comprises, as the essential ingredient, a polybutadiene polyol with a number-average molecular weight of 1,000–8,000 and having 2–10 hydroxyl groups per molecule (Polyol Aa), a polyester polyol with a number-average molecular weight of 13,000–30,000 and having 2–10 hydroxyl groups per molecule, said polyol being sometimes referred to as "Polyol Bb" herein, and a polybutadiene polyblock isocyanate with a number-average molecular weight of 1,000–8,000 and having 2–10 blockisocyanate groups per molecule (Isocyanate Xa), wherein the weight ratio of said polyols (as solid content) is (Polyol Aa) (Polyol Bb)=40:60–90:10 and said polyblock isocyanate (Isocyanate Xa) is in an amount of 0.8–3.5 gram equivalents based on the total hydroxyl groups of the polyols.

Said invention has been attained based on the findings by the present inventors that mixing a polybutadiene polyol with a number-average molecular weight of 1,000–8,000 and having 2–10 hydroxyl groups per molecule (Polyol Aa) and a polyester polyol with a number-average molecular weight of 13,000–30,000 and having 2–10 hydroxyl groups per molecule (Polyol Bb), and a polybutadiene polyblock isocyanate with a number-average molecular weight of 1,000–8,000 and having 2–10 hydroxyl groups per molecule (Isocyanate Xa) at a defined ratio provides a low shrinkage upon curing and that a protective film resulting from curing has such satisfactory flexibility, adherence, electrical insulation, chemical resistance, heat resistance, and the like properties.

DETAILED DESCRIPTION OF THE INVENTION

The group of inventions will be sequentially illustrated in detail below.

Firstly, the first invention will be illustrated in detail.

As for the ingredients of the present curable resin composition for flexible circuit overcoat, the ratio of a polyol with a number-average molecular weight of 1,000–8,000 and having 2–10 hydroxyl groups per molecule (Polyol A) to a polyblock isocyanate (Isocyanate X) is preferably in an amount of 0.8–3.5 gram equivalents of the polyblock isocyanate based on, i.e., per one gram equivalent of, the hydroxyl groups of the polyol.

A polyol with a number-average molecular weight of 1,000–8,000 and having 2–10 hydroxyl groups per molecule is important to impart properties to cured products, for example, those observed for rigid resins such as heat resistance, chemical resistance, and the like, as well as those observed for flexible resins such as flexibility, low shrinkage, and the like. When the molecular weight is below this range or when the number of hydroxyl groups per molecule exceeds this range, the crosslinking density upon curing becomes higher, providing harder cured products and insufficient properties for low shrinkage upon curing and flexibility of a cured film. On the other hand, when the molecular weight exceeds said range or when the number of hydroxyl groups per molecule is below said range, the crosslinking density upon curing becomes lower, providing more flexible cured products while significantly deteriorating heat resistance and chemical resistance of the cured film.

Any polyols with a number-average molecular weight of 1,000–8,000 and having 2–10 hydroxyl groups per molecule may be used as Polyol A, irrespective of the resin structure. Such polyols include, for example, acryl polyols prepared by copolymerization of a hydroxyl-group containing olefin such as a vinyl alcohol or allyl alcohol with another olefin; polyester polyols and polyether polyols retaining terminal hydroxyl groups by altering molar ratio of polymerization; and polybutadiene wherein hydroxyl groups are introduced upon denaturation of resin and hydroxyl-terminated polyolefins. Resins satisfying the above requirements for molecular weight and number of hydroxyl groups are all encompassed. Acryl polyols include "Desmofene A665" (manufactured by Sumitomo Bayer Urethane); polyester polyol (Polyol Bb), "HM-1" (manufactured by Arakawa Chemical Industry), "Eryether UE3320" (manufactured by Unitika Ltd.); hydroxyl group-containing polybutadiene (Polyol Aa), "G-1000", "GI-1000" and "GQ-1000" (manufactured by Nippon Soda Co., Ltd.); hydroxyl-terminated polyolefins, "Polyether-H" (manufactured by Mitsubishi Chemical Corp.). Among them, hydroxyl group-containing polybutadienes (Polyol Aa) are preferably used to impart flexibility.

Polyblock isocyanates (Isocyanate X) with a number-average molecular weight of 1,000–8,000 and having 2–10 block isocyanate groups per molecule are important to provide the cured products with both the properties of rigid resins such as heat resistance, chemical resistance, etc. and those of flexible resins such as flexibility, low shrinkage, etc. Where the molecular weight is below said range, or where the number of hydroxyl groups per molecule is above said range, the crosslinking density upon curing becomes higher, providing harder cured products. Therefore, properties satisfactory for flexibility of cured films or low shrinkage upon curing can not be obtained. On the other hand, where the molecular weight is above said range, or where the number of hydroxyl groups per molecule is below said range, the crosslinking density upon curing becomes lower, resulting in more flexible cured products, while heat resistance and chemical resistance of the cured film being remarkably deteriorated. Further, where such components (Polyol X) are those having polybutadiene skeletons (Polyol Xa), they serve to improve low shrinkage upon curing and flexibility.

Polyblock isocyanates (Isocyanate X) may be obtained by blocking polyisocyanate having two or more functional groups with a blocking agent. Such polyisocyanates include, for example, diisocyanates such as toluene-2,4-diisocyanate, toluene-2,6-diisocyanate, hexamethylene diisocyanate, xylylene diisocyanate, diphenyl methane diisocyanate, isophorone diisocyanate; those having three or more functional groups prepared from the above diisocyanates utilizing cyclization and trimerization of isocyanate groups; and those having three or more functional groups prepared by partly reacting isocyanate groups with various polyols. Blocking agents include, for example, a compound having only one active hydrogen atom which can react with an isocyanate group, per molecule and preferably dissociates again at a temperature below 170 ° C. after reaction with the isocyanate group, and include, for example, $\epsilon$-caprolactam, diethyl malonate, ethyl acetoacetate, acetoxime, methylethylketoxime, phenol, cresol, etc.

Among them, in order to improve low shrinkage during curing and flexibility, polyisocyanates having butadiene skeletons in their molecules and blocked with the above blocking agents (Isocyanate Xa) are preferred, and include, for example, "TP-1002" (manufactured by Nippon Soda Co., Ltd.), "HTP-9", "HTP-5MLD" and "Unimax P" (manufactured by Idemitsu Petrochemical).

Moreover, the present composition may optionally comprise a curing accelerator for polyol and isocyanate, a filler, an additive, a thixotropic agent, a solvent and the like as optional components, in addition to the above essential components. Particularly, in order to improve bending resistance, fine rubber particles may be preferably added. Moreover, fine polyamide particles may be added to further improve adherence to a base copper circuit, a base material such as a polyimide or polyester film, an adhesive layer, etc.

Such fine rubber particles include, for example, any fine particles of resins exhibiting rubber elasticity such as acrylonitrile butadiene rubber, butadiene rubber, acryl rubber, which have been subjected to chemical crosslinking treatment to make insoluble in an organic solvent and infusible. For example, "XER-91" (manufactured by Japan Synthetic Rubber Co., Ltd.), "Staphyloide AC3355", "Staphyloide AC3832" and "IM101" (manufactured by Takeda Chemical Industries, Ltd.), "Paraloide EXL2655" and "Paraloide EXL2602" (manufactured by Kureha Chemical Industries, Co., Ltd.) are encompassed.

Fine polyamide particles include any fine particles of 50 micron or smaller consisting of resin having amide linkages, for example, fatty polyamides such as nylon, aromatic polyamides such as Kevlar, and polyamidoimides. For example, "VESTOSINT 2070" (manufactured by Daicel Huls) and "SP500" (manufactured by Toray Industries, Inc.) may be mentioned.

The method of curing the curable resin composition of the present invention in itself is not particularly limited, but carried out according to the conventional methods.

Now, the second invention will be illustrated in detail.

The effect of polyols with a number-average molecular weight of 1,000–8,000 and having 2–10 hydroxyl groups per molecule (Polyol A) on the physical properties of the cured product of the curable resin composition of the present invention is same as that explained in relation to the first invention.

A polyol with a number-average molecular weight of 200–600 and having 2–10 hydroxyl groups per molecule (Polyol C) is a component to impart properties inherent to rigid cured materials such as-heat resistance and-chemical resistance to the cured products of the curable resin composition of the present invention, and serves to increase the crosslinking density upon curing. On the other hand, a polyol with a number-average molecular weight of 13,000–30,000 and having 2–10 hydroxyl groups per molecule is important to impart properties inherent to flexible cured materials such as improved low shrinkage upon curing and flexibility of the cured products.

When Polyol C is solely cured using polyisocyanate, the crosslinking density becomes relatively higher, resulting in insufficient low shrinkage upon curing and insufficient flexibility of the coat film. On the other hand, when Polyol B is solely cured using polyisocyanate, the crosslinking density is remarkably reduced, resulting in remarkably deteriorated properties of the coat film such as heat resistance and chemical resistance. To obtain satisfactory low shrinkage upon curing, and comply with flexibility, heat resistance, and chemical resistance of the coat film, it is necessary to mix two types of polyols having different properties at a certain ratio. That is, it is preferable to use two polyols mixed at the ratio, i.e., (Polyol C):(Polyol B)=20:80–50:50. When the amount of Polyol C is less than this range, the crosslinking density excessively decreases, resulting in remarkably deteriorated properties of the coat film such as heat resistance, and chemical resistance. On the other hand, when the amount of Polyol C is greater, the crosslinking density excessively increases, resulting in deteriorated low shrinkage upon curing and decreased -flexibility of the coat film.

On the other hand, when Polyol A is solely cured using polyisocyanate, the cured product thus obtained is relatively balanced in such properties as low shrinkage upon curing, and heat resistance, chemical resistance and flexibility, but the low shrinkage upon curing and flexibility are not completely satisfactory. Therefore, it is necessary to use Polyol A in combination with Polyol B. That is, it is preferable to use them by mixing within the range, (Polyol A):(Polyol B)=40:60–90:10. When the amount of Polyol A is smaller than this range, the crosslinking density is excessively reduced, resulting in remarkably deteriorated properties such as heat resistance, and chemical resistance of the coat film.

Polyol A, including Polyol Aa, is the same as those previously explained in relation to the first invention.

Polyol B may be any polyol with a number-average molecular weight of 13,000–30,000 and having 2–10 hydroxyl groups per molecule, irrespective of the resin structure, and include those satisfying the above requirements for molecular weight and number of hydroxyl groups, for example, acryl polyols prepared by copolymerization of a hydroxyl group-containing olefin such as a vinyl alcohol or allyl alcohol with another olefin; polyester polyol (Polyol Bb) or polyether polyol retaining terminal hydroxyl groups by altering molar ratio during polymerization; as well as polybutadiene prepared by introducing hydroxyl groups by denaturing the resin (Polyol Ba), hydroxyl-terminated polyolefin, etc.

Such acryl polyols include, for example, "Desmophene A450" (manufactured by Sumitomo Bayer Urethane); polyester polyols include, for example, "Bilon-200" (manufactured by Toyobo Co., Ltd.), "Eryether UE3600" (manufactured by Unitika Ltd.), as well as a hydroxyl group-containing polyisoprene, "LIR506" (manufactured by Kuraray Co., Ltd.), and the above Polyol A wherein the hydroxyl groups have been partly crosslinked to polymerize using polyisocyanate, polycarboxylic acid, polyacid anhydride, or the like. Among them, in order to impart more flexibility, hydroxyl group-containing polybutadienes with a molecular weight of 1,000–8,000 (Polyol Aa), wherein the hydroxyl groups have been partly crosslinked using polyisocyanate, polycarboxylic acid, polyacid anhydride or the like, are preferred.

Polyol C includes those polyols with a number-average molecular weight of 200–600 and having 2–10 hydroxyl groups per molecule, irrespective of the resin structure. For example, EO denatured pentaerythritol, "PE555" (manufactured by Toho Chemical Industries Co., Ltd.), EO denatured trimethyrol propane, "TP880" (manufactured by Toho Chemical Industries Co., Ltd.), and polycaprolactone triol, "Prakcel 303", and "Prakcel 305" (manufactured by Daicel Huls).

Polyblock isocyanates (Isocyanate X), including polybutadiene polyblock isocyanates (Isocyanate Xa), are the same as described above for the first invention.

Optional ingredients, in addition to the above essential ones, may be added as needed or optionally to the present composition. Such ingredients are the same as described above for the first invention.

The method of curing the present curable resin composition in itself is not particularly limited, but carried out according to the conventional methods.

Finally, the third invention will be illustrated in detail.

Effects of polybutadiene polyols with a number-average molecular weight of 1,000–8,000 and having 2–10 hydroxyl groups per molecule (Polyol Aa) on the physical properties of the cured products of the curable resin composition of the present invention is the same as those of Polyol A explained above for the first invention. Such polybutadienes (Polyol Aa), due to their polybutadiene skeletons, have effect to improve low shrinkage upon curing of the resin composition of the present invention and the flexibility of the cured resin composition, i.e., the cured product.

Polyester polyols with a number-average molecular weight of 13,000–30,000 and having 2–10 hydroxyl groups per molecule (Polyol Bb) are important to provide properties inherent to flexible cured materials such as low shrinkage upon curing, increased flexibility and the like, as well as to improve adherence to base materials due to effect of highly polar ester linkage contained in the resin skeletons.

The effects of block isocyanates (Isocyanate X), including polybutadiene polyblock isocyanate (Isocyanate Xa), on the cured product from the curable resin composition of the present invention is same as those explained above for the first invention.

When a polybutadiene polyol (Polyol Aa) is solely cured with a polybutadiene polyisocyanate (Isocyanate Xa), the resulting cured material is relatively balanced in such properties as low shrinkage upon curing, and heat resistance, chemical resistance, and flexibility; but the low shrinkage upon curing, and flexibility, and adherence to base material are insufficient. Therefore, it is necessary to use Polyol Aa in combination with polyester polyol (Polyol Bb). That is, it is preferable to use them by mixing at a ratio (Polyol Aa):(Polyol Bb)=40:60–90:10. When the amount of Polyol Aa is smaller than this range, the crosslinking density is excessively reduced, resulting in remarkably deteriorated properties such as heat resistance, chemical resistance and the like of the coat film. A polybutadiene polyblock isocyanate (Isocyanate Xa) is preferably in an amount of 0.8–3.5 gram equivalents based on the total hydroxyl groups of the polyol. The smaller or greater amount compared with the said range results in excessively reduced crosslinking density, providing remarkably deteriorated properties such as heat resistance, chemical resistance and the like of the coat film.

As polybutadiene polyols (Polyol Aa), any polyol with a number-average molecular weight of 1,000–8,000 and having 2–10 hydroxyl groups per molecule and a butadiene skeleton, may be used. For example, "G-1000", "GI-1000", and "GQ-100" (manufactured by Nippon Soda C.o., Ltd.), and "R-45EPI" (manufactured by Idemitsu Petrochemical) may be mentioned.

As polyester polyols (Polyol Bb), any polyol with a number-average molecular weight of 13,000–30,000 and having 2–10 hydroxyl groups per molecule as well as polyester skeleton may be used. For example, "Bilon-200", "Bilon-103" and "Bilon-600" (manufactured by Toyobo Co., Ltd.), "Eryether UE3400", "Eryether UE3500" and "Eryether UE3600" (manufactured by Unitika Ltd.), "Aronmelt PES310-S30", "Aronmelt PES340-S30" and "Aronmelt PES390-S30" (manufactured by Toagosei Co., Ltd.) are included.

Polybutadiene polyblock isocyanates (Isocynate Xa) are those obtained by blocking isocyanate-containing polybutadiene polyisocyanate with a blocking agent. Such polybutadiene polyisocyanates include, for example, diisocyanates such as toluene-2,4-diisocyanate, toluene-2,6-diisocyanate, hexamethylene diisocyanate, xylylene diisocyanate, diphenyl methane diisocyanate, and isophorone diisocyanate; the above diisocyanates which have been made to have three or more functional groups utilizing cyclization and trimerization of the isocyanate groups; and those prepared by reacting a diisocyanate which has been made to have three or more functional groups by partly reacting the isocyanate groups with various polyols, with a hydroxyl group-containing polybutadiene having a number-average molecular weight of 600–7,000. Isocyanate Xa includes, for example "TP-1002" (manufactured by Nippon Soda Co., Ltd.), and "HTP-9", "HTP-5MLD" and "Unimax P" (manufactured by Idemitsu Petrochemical). Blocking agents include, for example, a compound having only one active hydrogen atom which is able to react with an isocyanate group, per molecule and preferably dissociates again at a temperature not higher than 170° C. after reaction with the isocyanate group, and include, for example, $\epsilon$-caprolactam, diethyl malonate, ethyl acetoacetate, acetoxime, methylethylketoxime, phenol, cresol, etc.

The composition of the present invention may be compounded with optional ingredients in addition to the above essential ones as needed or optionally. Such optional ingredients are the same as those described in relation to the first invention.

The method of curing the curable resin composition of the present invention in itself is not particularly limited, and carried out according to the conventional methods.

The group of inventions so linked as to form a single general inventive concept are explained classifying into three types of inventions. However, such explanation is made just to facilitate understanding. A curable resin composition which contains at least one polyol selected from the group consisting of Polyol A, including polybutadiene polyol (Polyol Aa), Polyol B, including polybutadiene polyol (Polyol Ba) and polyester polyol (Polyol Bb), and Polyol C, and at least one polyblock isocyanate selected form the group consisting of polyblock isocyanate (Isocyanate X), including polybutadiene polyblock isocyanate (Isocyanate Xa), and which provides cured products (coat film) having the same properties as those of the above described curable resin compositions of the first to third inventions are encompassed in the present invention.

EXAMPLES

The production examples of polyols and block isocyanates to be used in the present invention and examples of the present invention as well as comparative examples will be described to further explain the present invention.

(a)Production Examples of Resins used in Examples and Comparative Examples

<Production of Resin varnish E>

"Bilon-200" (OH terminated polyester, Mn=ca. 15,000, OH equivalent=7,014 g/eq., and solid content=100 wt %: manufactured by Toyobo Co., Ltd.) (2,250 g), ethyl diglycol acetate (manufactured by Daicel Chemical Industries, Ltd.) (1,833 g), and "Ipsol 150" (manufactured by Idemitsu Petrochemical) (917 g) were charged in a reactor, and stirred while heating at 130° C. to dissolve to obtain a resin varnish. The product will be called Resin varnish E.

Properties of Resin varnish E: Mn=ca. 15,000, OH equivalent (including the solvent)=15,586 g/eq., and solid content=45 wt %.

<Production of Resin varnish F>

"HTP-9" (NCO terminated polybutadiene, Mn=ca. 2,800, NCO equivalent=467 g/eq., and solid content=100 wt %: manufactured by Idemitsu Petrochemical) (1,000 g), ethyl diglycol acetate (manufactured by Daicel Chemical Industries, Ltd.) (216 g) and dibutyltin laurate (0.1 g) were charged in a reactor, and mixed to be homogeneously dissolved. Once the mixture became homogeneous, it was raised in temperature to 70° C. and further stirred while methylethylketoxime (molecular weight, 87.12) (224 g) was added dropwise with stirring over a period of 2 hours. The mixture was kept at the same temperature for an additional hour, and cooled at the time when FT-IR indicated disappearance of the NCO peak at 2,250 cm$^{-1}$, to obtain a resin varnish. The product will be called Resin varnish F.

Properties of Resin varnish F: Mn=ca. 2,800, NCO equivalent(including the solvent)=672.5 g/eq., and solid content=85 wt %.

<Production of Resin varnish G>

"G-1000" (OH terminated polybutadiene, Mn=ca 1,600, OH equivalent=801 g/eq., solid content=10.0 wt %: manufactured by Nippon Soda Co., Ltd.) (1,000 g), "Ipsol 150" (manufactured by Idemitsu Petrochemical) (591 g) and dibutyltin laurate (0.1 g) were charged in a reactor, mixed and homogeneously dissolved. The mixture was raised in temperature to 70° C. at the time when the mixture became homogeneous and further stirred while toluene-2,4-diisocyanate (NCO equivalent=87.08 g/eq.) (97.8 g) was added dropwise with stirring over a period of 2 hours. The mixture was kept at the same temperature for an additional hour, and cooled at the time when FT-IR indicated disappearance of the NCO peak at 2,250 cm$^{-1}$, to obtain a resin varnish. The thus obtained resin varnish will be called Resin varnish G.

Properties of Resin varnish G: Mn=ca. 17,000, OH equivalent (including the solvent)=13,532 g/eq., and solid content=65%.

(b) Details of the Individual Ingredients used in Examples and Comparative Examples <Polyol A>

"Desmophene A665" (acryl polyol, Mn=ca. 1,000, OH equivalent (including the solvent)=607 g/eq., and solid content=65 wt %: manufactured by Sumitomo Bayer Urethane)

"G-1000" (polybutadiene polyol, being also a Polyol Aa, Mn=ca. 1,500, OH equivalent=801 g/eq., and solid content=100 wt %: manufactured by Nippon Soda Co., Ltd.)

<Polyol B>

"LIR506" (polyisoprene polyol, Mn=ca. 25,000, OH equivalent=4,237 g/eq., and solid content=100 wt %: manufactured by Kuraray Co., Ltd.)

Resin varnish G (polybutadiene polyol, being also a Polyol Ba, Mn=ca. 17,000, OH equivalent (including the =solvent)=13,532 g/eq., and solid content=65 wt %)

Resin varnish E (polyester polyol, being also a Polyol Bb, Mn=ca. 15,000, OH equivalent (including the solvent)=15, 586 g/eq., and solid content=45 wt %)

<Polyol C>

"PE555" (EO denatured pentaerythritol, Mn=ca. 550, OH equivalent=138 g/eq., and solid content=100 wt %: manufactured by Toho Chemical Industries Co., Ltd.)

<Polyblock isocyanate X>

"BL4265" (oxime block isocyanate of isophorone diisocyanate trimer, NCO equivalent (including the solvent)=519 g/eq., and solid content=65 wt %: manufactured by Sumitomo Bayer Urethane)

Resin varnish F (polybutadiene polyblockisocyanate, being also a Isocyanate Xa, Mn=ca. 2,800, NCO equivalent (including the solvent)=672.5 g/eq., and solid content=85 wt %)

(c) Measurement of the Properties of Coat Film (1) Warp upon cure shrinkage: Sample is coated (25 mm×35 mm×25 μm) on a polyimide film (35 mm×60 mm×75 μm), and the degree of warp after curing is measured.

(2a) Anti-bending test (1): Mandrel test; Bending test is carried out by bending within the range from 1 to ⅛ inches diameter. The result is expressed as a minimum diameter generating no crack.

(2b) Anti-bending test (2): This test is carried out according to JIS D0202. The diameter of the bent section is 0.38 mm. The number of repetition of bending before the sample is cracked is measured. The results are expressed as X: less than 10, Δ: 10–1,000, o: 1,000–2,000, and ⊚: more than 2,000.

(3) Pencil hardness test: According to JIS D0202.

(4) Electric insulation: Sample is coated on a tandem electrode (conductor width, 0.318 mm), and electric resistance after boiling for an hour is measured.

(5) Chemical resistance: A paint coat is rubbed with a waste soaked with acetone or isopropanol. The results are expressed as o: nothing abnormal observed, and X: coating deteriorated.

(6) Heat resistance upon soldering; Flux JS-64MS-S is coated onto a paint coat, which is soaked in a soldering bath at 260° C. for 10 seconds. The results are expressed as o: nothing abnormal observed, and X: blister generated.

(7) Adherence: According to JIS D0202, the test is carried out on copper, polyimide "Yupilex S" manufactured by Ube-Kosan Co., Ltd., and the adhesive layer of flexible substrate as base materials. The results are expressed as X: 0/100–50/100, Δ: 51/100–99/100, and o: 100/100.

(d) Preparation and Curing of Curable Resin Compositions

The above polyols, polyblock isocyanates, fine rubber particles and fine polyamide particles were properly compounded in such ratios as shown in the following Table 1. Then, as other ingredients, dibutyltin laurate as a curing accelerator, "Aerosil 200" (manufactured by Nihon Aerosil) as an anti-sagging agent, and carbitol acetate as a viscosity adjuster were added in appropriate amounts for each case and mixed, followed by kneading using a three roll mill to prepare curable resin composition samples A1–A9 corresponding to Examples 1–9, respectively. The thus prepare samples A1–A9 were each coated on bases in about 25 μm thickness, and cured under the conditions of 150° C. for 60 minutes, to prepare test samples of cured products. Incidentally, in the table, Examples 1–2 (Samples A1–A2) are embodiments of the first invention, Examples 3–6 (Samples A3–A6), of the second invention, and Example 7 (Sample A7), of the third invention.

The products were measured according to the above method for measurement of the properties of coat film given under (c) above. The results are shown in the Table 2 below.

TABLE 1

| | Examples | | | | | | | | |
|---|---|---|---|---|---|---|---|---|---|
| | 1 | 2 | 3 | 4 | 5 | 6 | 7 | 8 | 9 |
| Samples | A1 | A2 | A3 | A4 | A5 | A6 | A7 | A8 | A9 |
| Polyol A: "Desmophene A665" | 10 | | 9.2 | | | | | | |
| Polyol Aa: "G-1000" | | 10 | | 6 | | | 6 | 6 | 6 |
| Polyol B: "LIR506" | | | 4 | | 6 | | | | |
| Polyol Ba: Resin varnish G | | | | 6.2 | | 9.2 | | | |
| Polyol Bb: Resin varnish E | | | | | | | 8.9 | 8.9 | 8.9 |
| Polyol C: "PE555" | | | | | 4 | 4 | | | |
| Polyisocyanate X: "BL4265" | 8.6 | | 8.4 | | 15.8 | | | | |
| Polyisocyanate Xa: Resin vernish F | | 8.4 | | 5.4 | | 20 | 5.5 | 5.5 | 5.5 |
| Fine rubber particle: "XER-91" | | | | | | | | | 2 |
| Fine polyamide particle: "VENTSINT" | | | | | | | | 1 | 1 |

TABLE 2

| | Examples | | | | | | | | |
|---|---|---|---|---|---|---|---|---|---|
| | 1 | 2 | 3 | 4 | 5 | 6 | 7 | 8 | 9 |
| Samples | A1 | A2 | A3 | A4 | A5 | A6 | A7 | A8 | A9 |
| Wrap (mm) | 1.2 | 0.8 | 0.7 | 0.5 | 0.7 | 0.5 | 0.4 | 0.4 | 0.3 |
| Anti-bending test (1) Mandrel | 1/8> | 1/8> | 1/8> | 1/8> | 1/8> | 1/8> | 1/8> | 1/8> | 1/8> |
| Anti-bending test (2) | ○ | ○ | ○ | ◎ | ○ | ◎ | ◎ | ◎ | ◎ |
| Pencil hardness | 4H | 3H | 3H | 2H | 3H | 2H | 2H | 2H | 2H |
| Electric insulation (Ω) | 10th power | 10th power | 10th power | 10th power | 10th power | 10th power | 10th power | 10th power | 10th power |
| Chemical resistance: Acetone | ○ | ○ | ○ | ○ | ○ | ○ | ○ | ○ | ○ |
| Isopropanol | ○ | ○ | ○ | ○ | ○ | ○ | ○ | ○ | ○ |
| Heat resistance upon soldering | ○ | ○ | ○ | ○ | ○ | ○ | ○ | ○ | ○ |
| Adherence onto: Copper | ○ | ○ | ○ | ○ | ○ | ○ | ○ | ○ | ○ |
| Polyimide | Δ | ○ | ○ | ○ | ○ | ○ | ○ | ○ | ○ |
| Adhesive layer of Flexible substrate | ○ | Δ | ○ | Δ | ○ | Δ | ○ | ◎ | ◎ |

As in the Examples, Samples B1–B4 of Comparative Examples 1–4, respectively, were prepared using the compositions shown in the following Table 3, and evaluated in the same manner as in the above Examples. The results are shown in Table 4 below.

TABLE 3

| | Comparative Examples | | | |
|---|---|---|---|---|
| | 1 | 2 | 3 | 4 |
| Samples | B1 | B2 | B3 | B4 |
| Polyol A :"Desmophene A665" | | | 4.6 | |
| Polyol B :"L1R506" | | 10 | 7 | 3 |
| Polyol C :"PE555" | 10 | | | 7 |
| Polyisocyanate X:"BL4265" | 37.6 | 1.2 | 4.8 | 26.7 |

TABLE 4

| | Comparative Examples | | | |
|---|---|---|---|---|
| | 1 | 2 | 3 | 4 |
| Samples | B1 | B2 | B3 | B4 |
| Wrap (mm) | 9.0 | 0.5 | 0.5 | 5.0 |
| Anti-bending test(1) Mandrel | 1< | 1/8> | 1/8> | 1< |
| Anti-bending test(2) | X | ○ | ○ | X |
| Pencil hardness | 4H | F | F | 4H |
| Electric insulation(Ω) | 10th power | 8th power | 9th power | 10th power |
| Chemical resistance:Acetone | ○ | X | X | ○ |
| Isopropanol | ○ | ○ | ○ | ○ |
| Heat resistance upon soldering | ○ | X | X | ○ |
| Adherence onto:Copper | X | ○ | ○ | X |
| Polyimide | X | X | X | X |
| Adhesive layer of Flexible substrate | X | X | X | X |

As has been described above, curable resin compositions of the present invention are, compared with the conventional curable resin compositions, excellent in warp property upon curing, and the cured products thereof are particularly excellent in flexibility and excellent in such properties chemical resistance, heat resistance, electric insulation, bending resistance and adherence. For these reasons, curable resin compositions of the present invention are suitable for overcoat of flexible circuit.

What is claimed is:

1. A process for overcoating a flexible circuit comprising applying a curable resin composition to said flexible circuit which composition comprises a polybutadiene polyol with a number-average molecular weight of 1,000–8,000 and having 2–10 hydroxyl groups per molecule (Polyol Aa), and a polybutadiene blocked polyisocyanate with a number-average molecular weight of 1,000–8,000 and having 2–10 blocked isocyanate groups per molecule (Isocyanate Xa), and curing said composition.

2. A process for overcoating a flexible circuit comprising applying a curable resin composition to said flexible circuit which composition comprises a polyol with a number-average molecular weight of 1,000–8,000 and having 2–10 hydroxyl groups per molecule (Polyol A), a polyol with a number-average molecular weight of 13,000–30,000 and having 2–10 hydroxyl groups per molecule (Polyol B), and a blocked polyisocyanate (Isocyanate X) as the essential ingredient, wherein the weight ratio (as solid content) of said two polyols is (Polyol A):(Polyol B)=40:60–90:10, and said blocked polyisocyanate (Isocyanate X) is in an amount of 0.8–3.5 gram equivalents based on the total hydroxyl groups of the two polyols (Polyol A plus Polyol B), and curing said composition.

3. The process as set forth in claim 2 wherein said Polyol A is a polybutadiene polyol with a number-average molecular weight of 1,000–8,000 and having 2–10 hydroxyl groups per molecule (Polyol Aa), said Polyol B is a polybutadiene polyol with a number-average molecular weight of 13,000–30,000 and having 2–10 hydroxyl groups per molecule (Polyol Ba), and said Isocyanate X is a polybutadiene blocked polyisocyanate with a number-average molecular weight of 1,000–8,000 and having 2–10 blocked isocyanate groups per molecule (Isocyanate Xa), and wherein the weight ratio (as solid content) of said two polyols is (Polyol Aa):(Polyol Ba)=40:60–90:10, and said blocked polyisocyanate (Isocyanate Xa) is in an amount of 0.8–3.5 gram equivalents based on the total hydroxyl groups of the two polyols (Polyol Aa plus Polyol Ba).

4. A process for overcoating a flexible circuit comprising applying a curable resin composition to said flexible circuit which composition comprises a polyol with a number-average molecular weight of 200–600 and having 2–10 hydroxyl groups per molecule (Polyol C), a polyol with a number-average molecular weight of 13,000–30,000 and having 2–10 hydroxyl groups per molecule (Polyol B), and a blocked polyisocyanate (Isocyanate X), wherein the weight ratio (as solid content) of the polyols is (Polyol C):(Polyol B)=20:80–50:50 and the blocked polyisocyanate (Isocyanate X) is in an amount of 0.8–3.5 gram equivalents based on the total hydroxyl groups of the polyols, and curing said composition, wherein said Polyol B is a polybutadiene polyol with a number-average molecular weight of 13,000–30,000 and having 2–10 hydroxyl groups per molecule (Polyol Ba), and said Isocyanate X is a polybutadiene blocked polyisocyanate with a number-average molecular weight of 1,000–8,000 and having 2–10 blocked isocyanate groups per molecule (Isocyanate Xa).

5. A process for overcoating a flexible circuit comprising applying a curable resin composition to said flexible circuit which composition comprises, as the essential ingredient, a polybutadiene polyol with a number-average molecular weight of 1,000–8,000 and having 2–10 hydroxyl groups per molecule (Polyol Aa), a polyester polyol with a number-average molecular weight of 13,000–30,000 and having 2–10 hydroxyl groups per molecule (Polyol Bb), and a polybutadiene blocked polyisocyanate with a number-average molecular weight of 1,000–8,000 and having 2–10 blocked isocyanate groups per molecule (Isocyanate Xa), wherein the weight ratio of said polyols (as solid: content) is (Polyol Aa):(Polyol Bb)=40:60–90:10 and said blocked polyisocyanate (Isocyanate Xa) is in an amount of 0.8–3.5 gram equivalents based on the total hydroxyl groups of the polyols, and curing said composition.

6. The process as set forth in any one of claims 1, 3, 4, and 5 wherein the composition further comprises fine rubber particles and/or fine polyamide particles.

7. An overcoated flexible substrate obtained by the process of claim 1.

8. An overcoated flexible substrate obtained by the process of claim 2.

9. An overcoated flexible substrate obtained by the process of claim 3.

10. An overcoated flexible substrate obtained by the process of claim 4.

11. An overcoated flexible substrate obtained by the process of claim 5.

12. An overcoated flexible substrate obtained by the process of claim 6.

* * * * *